(12) United States Patent
Takeuchi et al.

(10) Patent No.: US 6,642,792 B2
(45) Date of Patent: Nov. 4, 2003

(54) SIGNAL AMPLIFICATION DEVICE WITH CIRCUIT MAINTAINING POTENTIAL OF INPUT SIDE OF CURRENT MIRROR CIRCUIT AT PREDETERMINED VALUE

(75) Inventors: Seiji Takeuchi, Hashima (JP); Tatsuya Takahashi, Ogaki (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/104,642

(22) Filed: Mar. 21, 2002

(65) Prior Publication Data

US 2002/0140508 A1 Oct. 3, 2002

(30) Foreign Application Priority Data

Mar. 29, 2001 (JP) ........................................ 2001-095895

(51) Int. Cl.[7] ................................................ H03F 3/45
(52) U.S. Cl. ......................................... 330/257; 330/288
(58) Field of Search ................................. 330/257, 288

(56) References Cited

U.S. PATENT DOCUMENTS 3,152,818 A * 10/1964 Suzuki ........................ 330/257
5,994,962 A * 11/1999 Watanabe et al. ............ 330/257

FOREIGN PATENT DOCUMENTS

JP          5277563    *   6/1977

OTHER PUBLICATIONS

Kleine et al. "Large Bandwidth BiCMOS Operational amplifiers for SC-video-applications", 1994 IEEE Symposium on Circuits and Systems vol. 5, May 2, 1994 vol 5 pp 85–88.*

* cited by examiner

Primary Examiner—Michael B. Shingleton
(74) Attorney, Agent, or Firm—Hogan & Hartson, LLP

(57) ABSTRACT

A differential amplifier circuit section (10), which realizes a reduction in power consumption of a signal amplification device, converts an input voltage signal into a current signal and then outputs the signal to a current mirror circuit section (12). Because an input-side current path of the current mirror circuit section (12) does not include a resistor and a current signal is not converted into a current signal at an output terminal (14) of the differential amplifier circuit section (10), a power supply voltage ($V_{DD}$) can be reduced to the value of product of source-drain voltages of transistors (MP2, MN2, and MN3). The current signal supplied to the input-side current path of the current mirror circuit section (12) is mirrored in the output-side current path and is then converted into a voltage signal through a resistor ($R_L$) disposed in the path to be generated from an output terminal (18).

3 Claims, 3 Drawing Sheets

SIGNAL AMPLIFICATION DEVICE WITH CIRCUIT MAINTAINING POTENTIAL OF INPUT SIDE OF CURRENT MIRROR CIRCUIT AT PREDETERMINED VALUE

BACKGROUND OF THE INVENTION

1. Field of the Invention

The present invention relates to a signal amplification device and, more particularly, relates to an amplification device which can be driven at a low voltage.

2. Description of the Related Art

A conventional amplifier may have a circuit constitution such as shown in FIG. 1. In such an amplifier, a charge signal obtained by a CCD (Charge Coupled Device) image sensor is converted into a voltage signal through a capacitance in a floating diffusion layer. The voltage signal is amplified by a source follower amplifier on a sensor chip and is then output from the sensor. A reset level of the floating diffusion layer periodically appears in output signals from the sensor. Accordingly, a correlated double sampling (CDS) circuit extracts the portion corresponding to a pixel signal among the output signals. The output signal extracted by the CDS circuit is further amplified by an amplifier using a differential amplifier circuit. In other words, such an amplifier includes a differential amplifier circuit 2 using a current mirror as a load. A reference voltage $V_{STD}$ is supplied to the gate of an MOS transistor MN02 as one input terminal. A voltage signal $V_{SIG}$ as a CCD output signal is supplied to the gate of an MOS transistor MN01 as the other input terminal. The differential amplifier circuit 2 generates an output signal according to a difference between the two supplied voltages. Because the differential amplifier circuit 2 uses a current mirror circuit as a load, the circuit 2 functions as a transconductance type amplifier. That is, a voltage signal is supplied as an input signal but a current signal is obtained as an output signal. The generated current signal is converted into a voltage signal $V_{OUT}$ by a resistor $R_L$ coupled to an output terminal 4 of the differential amplifier circuit 2. The operating point of the signal $V_{OUT}$ is determined in accordance with a constant current which is supplied from a transistor MN04 (gate bias voltage $V_{B2}$) as a constant-current source to the resistor $R_L$.

In the conventional amplifier shown in FIG. 1, the potential of the output terminal 4 of the differential amplifier circuit 2, namely, a node between the drain of the transistor MN02 and the drain of a transistor MP02 is equal to that of the voltage signal $V_{OUT}$. The potential is varied in accordance with the signal $V_{OUT}$. In the differential amplifier circuit 2, however, a plurality of transistors are arranged in series between a power supply voltage $V_{DD}$ and ground potential GND. Specifically, three MOS transistors of the transistor MP02 of the current mirror circuit, the transistor MN02 of the differential amplifier circuit, and a transistor MN03 (gate bias voltage $V_{B1}$) as a constant-current source are connected in series. To operate, each transistor requires a predetermined potential difference between the source and the drain. The remainder obtained by subtracting the potential difference from the $V_{DD}$-GND voltage is a voltage fluctuation allowance $\Delta V_{OUT}$ which is allowable at the output terminal 4. In the example conventional amplifier, the voltage $V_{DD}$ is set to a relatively large value, for example, +5V. In accordance therewith, the voltage fluctuation allowance $\Delta V_{OUT}$ is held enough.

In order to realize a reduction in the size of various portable devices, it is preferable that batteries of smaller size are used. Accordingly, power consumption by devices has been reduced so that the devices can operate for a sufficient time even when equipped with a small battery having a small capacity. In a digital still camera or video camera, such reduced power consumption and size reduction are desired. Meanwhile, as communication capacity has increased, it has become possible for portable telephones and portable terminals to receive and transmit images. As a result, there is a growing demand for mounting a photographing function on such devices. Because the portable telephones is small, a reduction in power consumption is further required in association with the small size. As one way of reducing power consumption, the CCD output signal processing circuit can be driven at a low voltage, namely, the power supply voltage $V_{DD}$ is reduced. When this is done, however, it is difficult to reduce the potential difference between the source and the drain of a transistor. The amount of reduction in the voltage $V_{DD}$ is fundamentally passed to the allowance $\Delta V_{OUT}$. Conversely, such a conventional amplifier has certain problems including that it is difficult to improve low-voltage driving while maintaining the amplitude of an output voltage signal and that power consumption cannot always be reduced as desired.

SUMMARY OF THE INVENTION

The present invention is made to solve the above problems. It is an object of the present invention to provide a signal amplification device in which low-voltage drive is realized while maintaining the amplitude of an output voltage signal, such that power consumption is reduced.

According to the present invention, there is provided a signal amplification device including a differential amplifier circuit which generates a first output according to an input signal and a current mirror circuit which receives the first output of the differential amplifier circuit to an input-side current path to generate a mirror current through an output-side current path in accordance with a current flowing through the input-side current path, wherein the mirror current is converted into an output voltage by a resistive load in the output-side current path of the current mirror circuit.

According to the present invention, the first output generated from the differential amplifier circuit is not converted into a voltage signal in principle at an output terminal of the differential amplifier circuit but is normally generated as a current signal, so that any fluctuation in potential at the output terminal is suppressed. Accordingly, the first output generated from the differential amplifier circuit is supplied to the input-side current path of the current mirror circuit. The current mirror circuit generates a mirror current through the output-side current path in accordance with the input-side current flowing through the input-side current path. In other words, the mirror current also fluctuates in accordance with the current fluctuation of the first output from the differential amplifier circuit in the input-side current path. As noted above, the current signal is transmitted to the output-side current path of the current mirror circuit. To suppress the potential fluctuation at the output terminal of the differential amplifier circuit, fundamentally, a resistor is not disposed in the path through which the current signal flows, in the input-side current path. Rather, a resistor is provided as a load in the output-side current path. A fluctuation in mirror current signal is converted into a voltage fluctuation across the resistor. The voltage fluctuation is extracted as an output voltage signal of the present voltage signal amplification device. A driving voltage for the differential amplifier circuit and the input-side current path can be reduced as much as the suppressed amount of voltage fluctuation at the output terminal of the differential amplifier circuit. Only a single transistor in the output-side current path is required for controlling a mirror current signal in accordance with a signal from the input-side current path. On the other hand, a plurality of transistors may be serially connected between power supply potential and ground potential in the differential amplifier circuit or the input-side current path. That is, the amplitude of the output voltage signal generated in the output-side current path can be large because there are fewer transistors in the output-side current path than in the differential amplifier circuit or the input-side current path. Accordingly, the driving voltage in the output-side current path can be reduced while the amplitude of the output voltage signal is maintained.

According to the present invention, the signal amplification device may be constituted in such a manner that the current mirror circuit comprises a potential setting circuit for holding the potential on the input side at a predetermined value.

The current mirror circuit comprises a pair of transistors whose gates (or bases) are connected to each other in the input-side current path and the output-side current path. A source-drain (emitter-collector) potential difference of the transistor disposed in the input-side current path can be fluctuated in accordance with a current on the input side. Generally, a fluctuation in potential difference is smaller than voltage drop in a simple resistor element. For example, potential at a node between the differential amplifier circuit and the input-side current path may fluctuate as explained above. According the present invention, however, the above-mentioned constitution includes means for holding the potential at the node to a predetermined value. Consequently, the voltage fluctuation at the output terminal of the differential amplifier circuit is fundamentally eliminated, so that the driving voltage for the differential amplifier circuit and the input-side current path can be reduced as much as the eliminated voltage fluctuation.

The signal amplification device according to the present invention may be constituted in such a manner that the current mirror circuit includes a constant-current source which supplies a constant current to the input-side current path such that a current signal from the differential amplifier circuit is superimposed on the supplied current from the constant-current source to form an input-side current.

With such a constitution, the input-side current flowing through an input-side transistor constituting the current mirror circuit is a current obtained by combining the supplied current from the constant-current source with the current signal from the differential amplifier circuit. That is, the input-side current causes a fluctuation in range of the current signal in the vicinity of the supplied current. When the supplied current from the constant-current source is changed, the operating point of the output voltage signal generated in the output-side current path can be adjusted. The source-drain (or emitter-collector) potential difference of the input-side transistor constituting the current mirror circuit can be fluctuated in accordance with the current signal from the differential amplifier circuit as mentioned above. The fluctuation allowance can be more suppressed as the input-side current, which is the supplied current, is larger. Accordingly, when the current is supplied from the constant-current source to the input-side current path, potential fluctuation at the node between the differential amplifier circuit and the input-side current path is suppressed, and the driving voltage for the differential amplifier circuit and the input-side current path can therefore be reduced.

According to the present invention, preferably, in the voltage signal amplification device, the current mirror circuit includes, as the only transistor in the output-side current path, a mirror-current generating transistor connected to the input-side current path to generate the mirror current. Consequently, while the amplitude of the output voltage signal is maintained, the output-side current path can be driven at the same voltage as the driving voltage needed for the differential amplifier circuit and the input-side current path.

DESCRIPTION OF THE PREFERRED EMBODIMENTS

Example embodiments of the present invention will now be described with reference to the drawings.

EMBODIMENT 1

Figure 1:
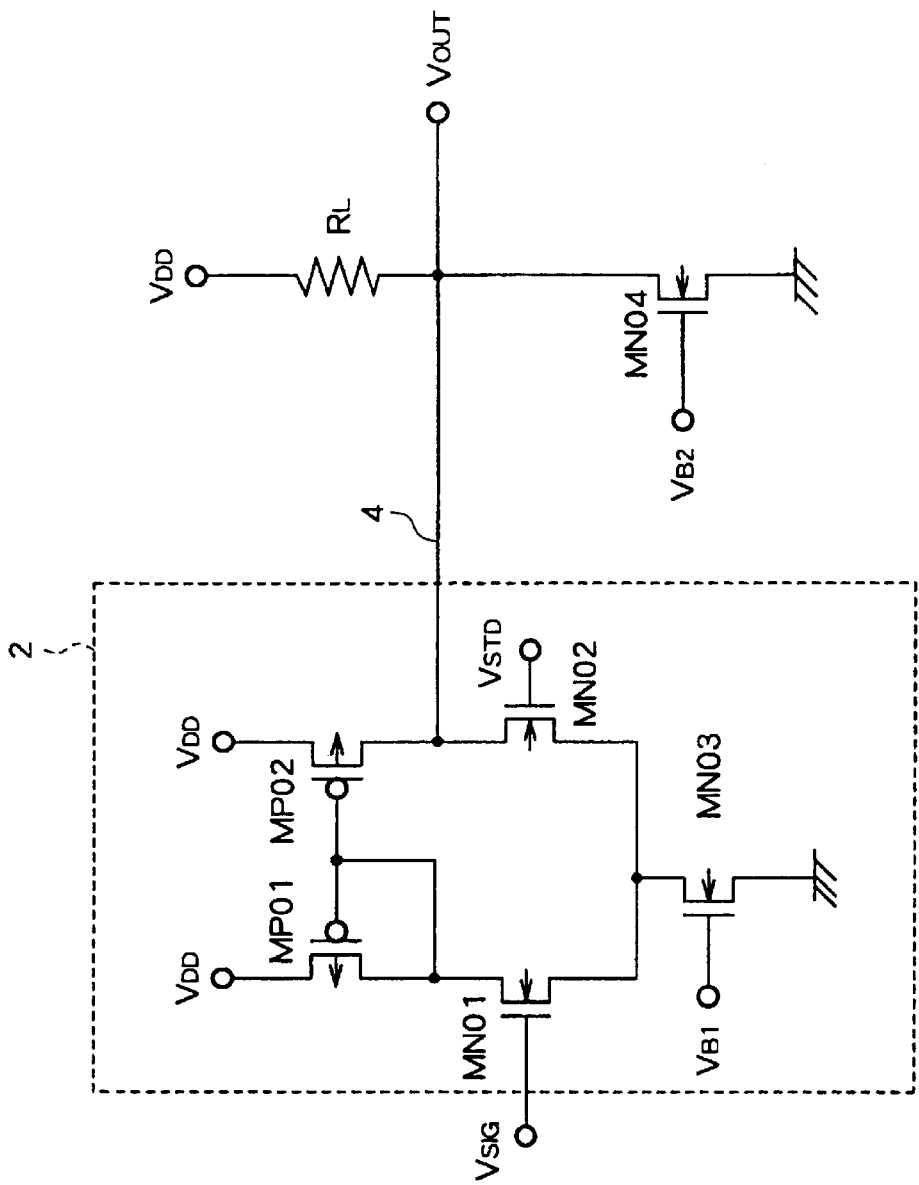
FIG. 1 is a circuit diagram of a conventional CCD output signal processing amplifier.
Figure 2:
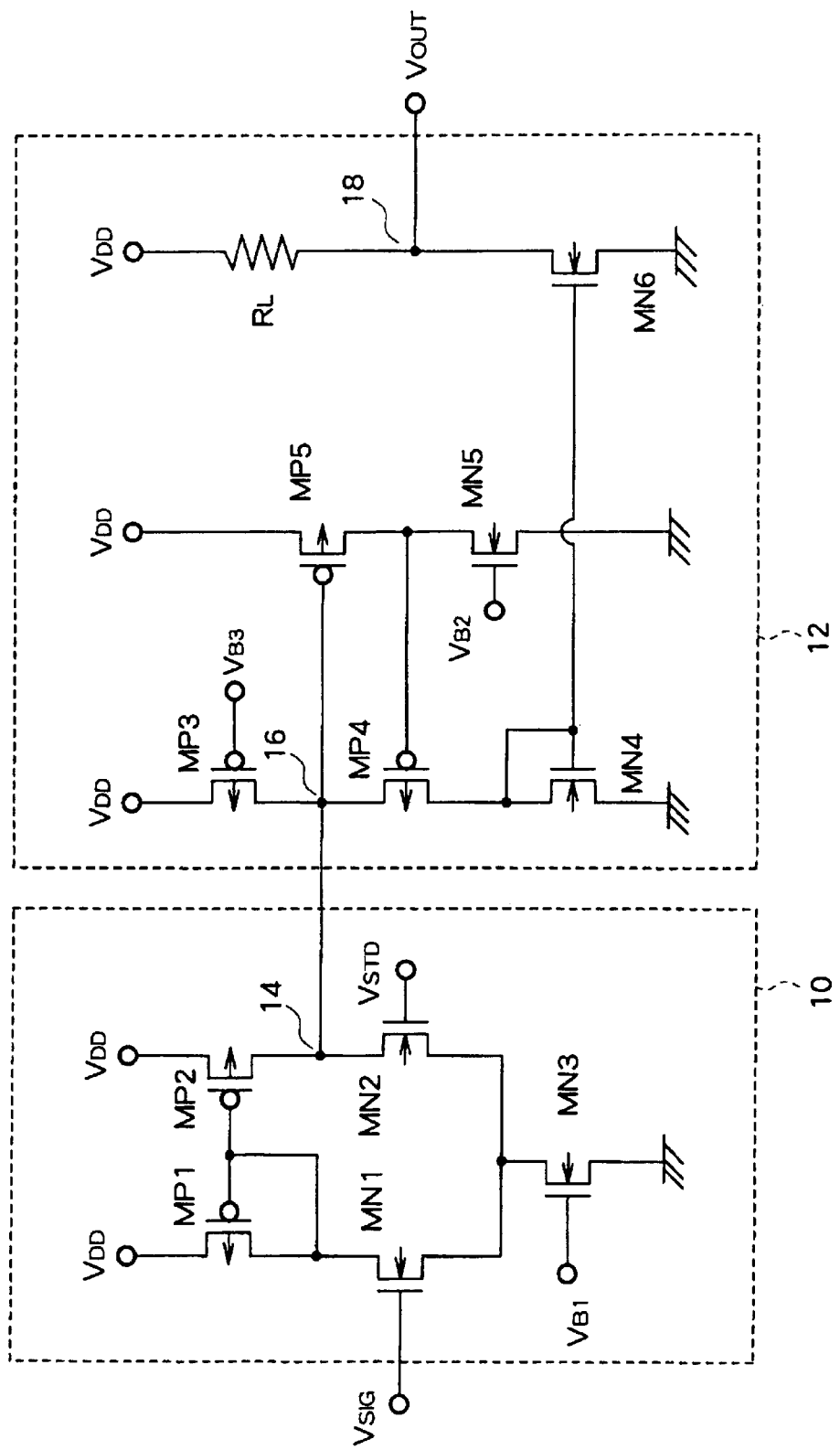
FIG. 2 is a circuit diagram of a CCD output signal processing amplifier according to a first embodiment of the present invention.

FIG. 2 is a circuit diagram of a CCD output signal processing amplifier according to a first embodiment of the present invention. The amplifier includes a differential amplifier circuit section 10 and a current mirror circuit section 12.

The differential amplifier circuit section 10 has such a constitution that a current mirror circuit including MOS transistors MP1 and MP2 is connected as a load to a differential amplifier circuit including an MOS transistor MN1 which receives the CCD output signal $V_{SIG}$ at the gate thereof, an MOS transistor MN2 which receives the reference voltage $V_{STD}$ at the gate thereof, and an MOS transistor MN3 which is connected to both of the sources of the above transistors and which receives the predetermined gate bias voltage $V_{B1}$ to function as a constant-current source. The power supply voltage $V_{DD}$ and the ground potential GND are connected as power supplies to the differential amplifier circuit section 10. Specifically, between the power supply voltage $V_{DD}$ and the ground potential GND, the transistors MP1, MN1, and MN3 are connected in series and the transistors MP2, MN2, and MN3 are connected in series. In the description of the present specification, reference symbol "MN" as a transistor denotes an N-channel MOS transistor and reference symbol "MP" denotes a P-channel MOS transistor.

In the example of this embodiment, the transistors MN1 and MN2 are constructed as transistors having the same characteristics, and the transistors MP1 and MP2 are also constructed such that they have the same characteristics. A voltage signal supplied to the differential amplifier circuit section 10 is a difference ($V_{SIG}-V_{STD}$) between the gate voltage of the transistor MN1 and that of the transistor MN2. This difference can be represented as $\Delta V_{IN}$, wherein:

$$\Delta V_{IN}=V_{SIG}-V_{STD}$$

The source-drain current of each of the transistors MN1 and MN2 fluctuates in accordance with the difference $\Delta V_{IN}$. The amount of fluctuation $\Delta i$ of the source-drain current of the transistor MN1 can be expressed by the following equation:

$$\Delta i=g_m\cdot\Delta V_{IN}/2 \qquad (1)$$

Reference symbol $g_m$ denotes conductance of the transistors MN1 and MN2. Because the transistor MN3 functions as a constant-current source, current fluctuation ($-\Delta i$), whose polarity is opposite to that in the transistor MN1, is caused as a source-drain current of the transistor MN2. The current change $\Delta i$ of the transistor MN1 is equal to a current change of the transistor MP1. The current change $\Delta i$ generated in the transistor MP1 causes a current change $\Delta i$ in the transistor MP2 constituting the current mirror circuit. At an output terminal 14 of the differential amplifier circuit section 10 disposed between the source of the transistor MP2 and the drain of the transistor MN2, a current supplied from the transistor MP2 is varied only by ($+\Delta i$) and a current supplied to the transistor MN2 is varied only by ($-\Delta i$). Consequently, a current of ($+2\Delta i$) flows from the output terminal 14 to the current mirror circuit section 12. The current of ($+2\Delta i$) is a current signal to be generated from the differential amplifier circuit section 10 to the current mirror circuit section 12. The signal can be shown as $AC_{IN}$, such that:

$$AC_{IN}=2\Delta i \quad (2)$$

A current path on the input side of the current mirror circuit section 12 includes the serial connection of MOS transistors MP3, MP4, and MN4 connected between the power supply voltage $V_{DD}$ and the ground potential GND. A current path on the output side thereof includes the serial connection of the resistor $R_L$ and an MOS transistor MN6 connected between the power source voltage $V_{DD}$ and the ground potential GND. An output terminal 18 of the current mirror circuit section 12 is disposed between the resistor $R_L$ and the transistor MN6. As components to suppress a potential fluctuation at a node 16 between the differential amplifier circuit section 10 and the current mirror circuit section 12, the current mirror circuit section 12 has the serial connection of MOS transistors MP5 and MN5 connected between the power supply voltage $V_{DD}$ and the ground potential GND.

The transistors MN4 and MN6 realize mirroring of the current between the input-side current path and the output-side current path.

The transistor MP3 is arranged between the power supply voltage $V_{DD}$ and the node 16. A predetermined DC bias voltage $V_{B3}$ is applied to the gate of the transistor MP3. The transistor MP3 functions as a constant-current source for supplying a constant current DCI to the input-side current path.

The source of the transistor MP4 is connected to the node 16 and the gate thereof is connected to the drain of the transistor MP5. The gate of the transistor MP5 is connected to the node 16. A feedback circuit for suppressing the potential fluctuation at the node 16 is constituted by the transistors MP4 and MP5. The transistor MN5 functions as a constant-current source for receiving the predetermined gate bias voltage $V_{B2}$ to supply a predetermined bias current to the transistor MP5. Specifically, the potential at the node 16 is fundamentally lower than the power supply voltage $V_{DD}$ by an amount equal to the gate-drain voltage of the transistor MP5 according to the predetermined bias current supplied from the transistor MN5. In this instance, the current signal $AC_{IN}$ supplied at the node 16 flows into the ground potential GND through the transistors MP4 and MN4. The fluctuation of the signal $AC_{IN}$ can lead to fluctuation of the potential at the node 16. This amount of fluctuation is accommodated by the feedback circuit including the transistors MP4 and MP5.

The signal $AC_{IN}$ input at the node 16 is combined with the constant current DCI supplied by the transistor MP3 and the resulting current is then supplied to the transistor MN4. The transistor MN6, whose gate is connected to that of the transistor MN4, generates a mirror current $I_M$ ($=\alpha_M I_I$) that is proportional to an input-side current $I_I$ ($=DCI+AC_{IN}$) flowing through the transistor MN4. In this instance, a ratio $\alpha_M$ of the current $I_I$ to the current $I_M$ is fundamentally determined in accordance with a ratio of the size of the transistor MN4 to that of the transistor MN6.

The mirror current $I_M$ flows through the resistor $R_L$, so that a current signal included in the current $I_M$ is converted into a voltage signal. In other words, a voltage signal $\Delta V_{OUT}$, which is expressed by the following expression, is generated at an output terminal 18. The signal is an output of the present amplifier.

$$\Delta V_{OUT}=\alpha_M \cdot AC_{IN} \cdot R_L \quad (3)$$

A gain G ($=\Delta V_{OUT}/\Delta V_{IN}$) of the present amplifier is obtained by the following equation using the expressions (1) to (3).

$$G=\alpha_M \cdot g_m \cdot R_L$$

Simplifying the above description, the differential amplifier circuit section 10 converts an output for the supplied CCD output signal $V_{IN}$ into not a voltage signal but a current signal and then supplies the resultant signal to the current mirror circuit section 12. The current mirror circuit section 12 mirrors the supplied current signal $AC_{IN}$ to the output-side current path. In the resistor $R_L$ in the output-side current path, the mirrored current signal according to the current signal $AC_{IN}$ is converted into a voltage signal.

On the output-terminal side of the differential amplifier circuit section 10, the three transistors MP2, MN2, and MN3 are connected in series between the power supply voltage $V_{DD}$ and the ground potential GND. Each of the transistors requires a specific source-drain voltage $V_{DS}$ to operate. In a conventional amplifier, a current signal is converted into a voltage signal in a resistor connected to the output terminal of a differential amplifier circuit section. Accordingly, in a conventional amplifier a voltage fluctuation is generated at the output terminal of the differential amplifier circuit section with the consequence that the power supply voltage $V_{DD}$ must have such magnitude that the source-drain voltages $V_{DS}$ of the three transistors and the voltage fluctuation at the output terminal can be held. In an amplifier according to the present invention, on the other hand, the conversion of a current signal into a voltage signal is not performed at the output terminal of the differential amplifier circuit section 10. That is, because a potential fluctuation at the output terminal is suppressed, the power supply voltage $V_{DD}$ capable of holding the voltages $V_{DS}$ of the three transistors is fundamentally enough. Therefore, the driving power supply voltage $V_{DD}$ for the differential amplifier circuit section 10 can be reduced compared with that of the conventional amplifier.

The input-side current path of the current mirror circuit section 12 includes the serial connection of the three transistors. The node 16 has the same potential as that at the output terminal 14. Accordingly, no fluctuation in potential is generated. Consequently, the input-side current path can also be operated at the power supply voltage $V_{DD}$, which is voltage lower than that of the conventional amplifier as in the case of the differential amplifier circuit section 10. When the power supply voltage $V_{DD}$ capable of driving three transistors is used, the path including the two transistors MP5 and MN5 can be driven. In the output-side current path including the only transistor, the voltage signal $\Delta V_{OUT}$ corresponding to the voltages $V_{DS}$ of two transistors is allowable. That is, the entire current mirror circuit section 12 can be driven at the low voltage $V_{DD}$ similarly used for the differential amplifier circuit section 10.

Because, as explained above, the entire amplifier can be driven at the voltage $V_{DD}$ and because this voltage is lower than the driving power supply voltage required for operating the conventional differential amplifier circuit section, power consumption of the amplifier is reduced.

EMBODIMENT 2

Figure 3:
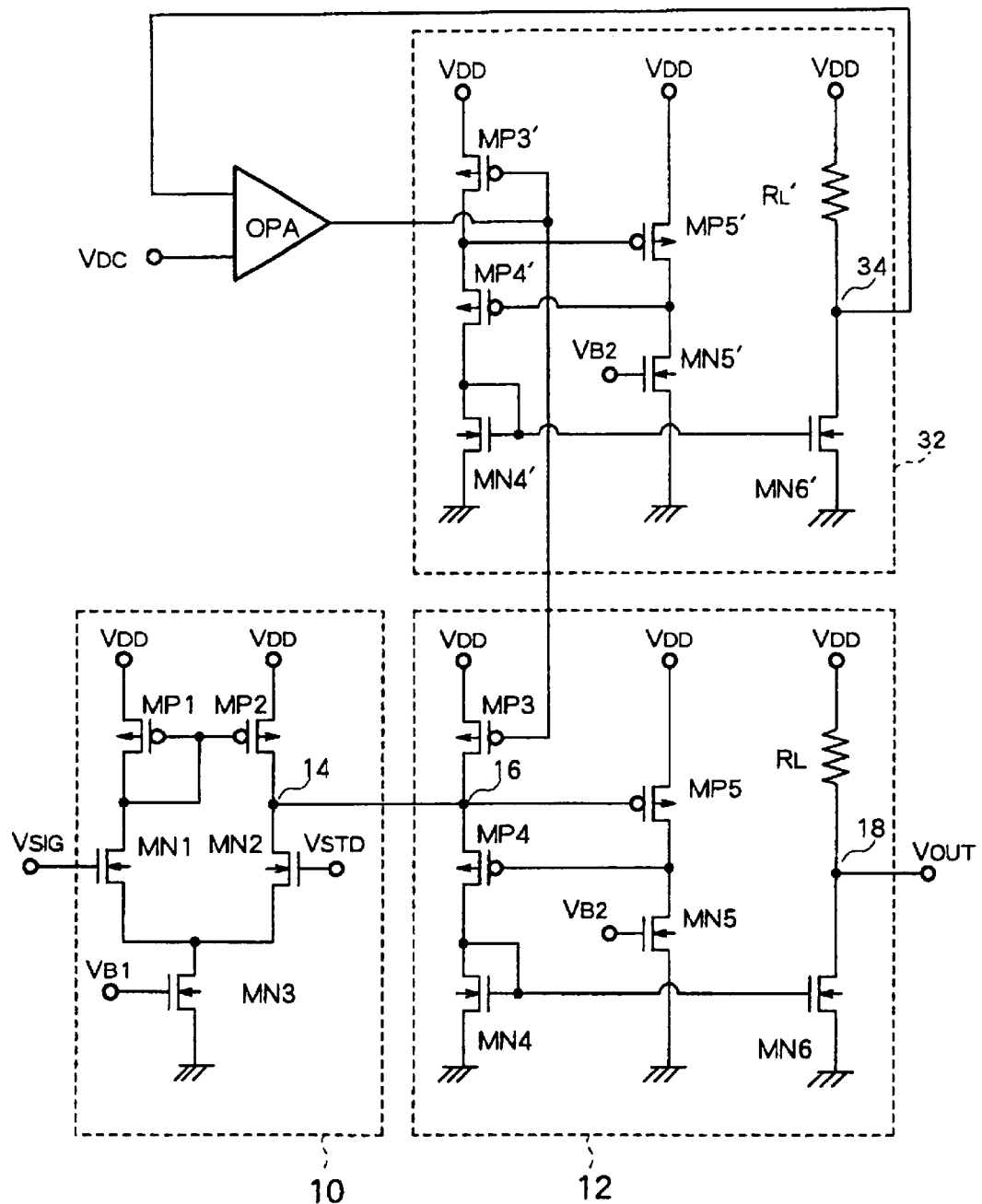
FIG. 3 is a circuit diagram of a CCD output signal processing amplifier according to a second embodiment of the present invention.

FIG. 3 is a circuit diagram of a CCD output signal processing amplifier according to a second embodiment of the present invention. To simplify the following description, the same reference numerals and symbols are used as in the first embodiment where they designate the same components.

The example amplifier according to the present embodiment is constituted in such a manner that an output level compensator circuit section for adjusting an operating point of the output voltage signal $V_{OUT}$, namely, a direct-current offset level (DC level) is added to the amplifier according to the first embodiment. The output level compensator circuit section includes an operational amplifier OPA and a current mirror circuit section 32.

The current mirror circuit section 32 is constituted so as to be identical with the current mirror circuit section 12. Accordingly, each component of the current mirror circuit section 32 is designated by adding a comma (') to the reference numeral of the corresponding component of the current mirror circuit section 12. The current mirror circuit section 32 is different from the current mirror circuit section 12 with respect to signals to be input and output. First, a circuit corresponding to the differential amplifier circuit section 10 is not connected to the current mirror circuit section 32. One terminal of a resistor $R_L'$ of the current mirror circuit section 32 corresponds to the output terminal of the current mirror circuit section 12. This terminal is referred to as a dummy output terminal 34. The dummy output terminal 34 is connected to one input terminal of the operational amplifier OPA. A DC level $V_{DC}$ of the target voltage signal $V_{OUT}$ is supplied to the other input terminal of the operational amplifier OPA. The operational amplifier OPA comprises an inverting amplifier performs control to feed back a gate voltage of a transistor MP3' so that the potential at the dummy output terminal 34 is equal to the output level $V_{DC}$.

An output terminal of the operational amplifier OPA is also connected to the gate of the transistor MP3 of the current mirror circuit section 12. When the gate voltage of the transistor MP3' is controlled so that the potential at the dummy output terminal 34 is equal to the level $V_{DC}$, the potential at the output terminal 18 of the current mirror circuit section 12 with the same constitution as that of the current mirror circuit section 32 is also set to the level $V_{DC}$.

In the constitution according to the first embodiment, the DC level $V_{DC}$ of the output voltage signal can be also adjusted by changing a gate voltage $V_G$ of the transistor MP3. However, such adjustment to obtain the target level $V_{DC}$ can be complicated or difficult. On the other hand, with the present amplifier, when the target level $V_{DC}$ is supplied to the operational amplifier OPA, the DC level at the output terminal 18 is automatically adjusted to the target level $V_{DC}$.

With the signal amplification device of the present invention, the driving voltage can be reduced, so that the power consumption can be reduced.

What is claimed is:

1. A signal amplification device comprising:
    a differential amplifier circuit which generates a first output according to an input signal; and
    a current mirror circuit which receives the first output of the differential amplifier circuit to an input-side current path and generates a mirror current through an output-side current path in accordance with a current flowing through the input-side current path, wherein
        the mirror current is converted into an output voltage by a resistive load in the output-side current path of the current mirror circuit, and
        the current mirror circuit comprises a potential setting circuit which maintains the potential of the input side at a predetermined value.

2. The device according to claim 1, wherein the current mirror circuit comprises a constant-current source which supplies a constant current to the input-side current path such that a current signal from the differential amplifier circuit is superimposed on the supplied current from the constant-current source to form an input-side current.

3. The device according to claim 1, wherein the current mirror circuit comprises, as the sole transistor in the output-side current path, a mirror current generating transistor which is connected to the input-side current path for generating the mirror current.

* * * * *